United States Patent [19]

Futatsuka et al.

[11] 4,249,941

[45] Feb. 10, 1981

[54] COPPER BASE ALLOY FOR LEADS OF INTEGRATED CIRCUIT

[75] Inventors: Rensei Futatsuka; Tadao Sakakibara, both of Aizuwakamatsu, Japan

[73] Assignee: Tamagawa Kikai Kinzoku Kabushiki Kaisha, Tokyo, Japan

[21] Appl. No.: 93,923

[22] Filed: Nov. 13, 1979

[30] Foreign Application Priority Data

Nov. 20, 1978 [JP] Japan .................... 53-142290

[51] Int. Cl.$^3$ .................................... C22C 9/02
[52] U.S. Cl. ................................ 75/153; 75/154
[58] Field of Search ......................... 75/153, 154; 148/11.5 C, 12.7 C, 13.2, 160

[56] References Cited

U.S. PATENT DOCUMENTS

| | | | |
|---|---|---|---|
| 2,128,955 | 9/1938 | Montgomery | 75/154 |
| 2,210,670 | 8/1940 | Kelly | 75/154 |
| 3,639,119 | 2/1972 | McLain | 75/154 |
| 3,698,965 | 10/1972 | Ence | 75/153 |
| 3,923,558 | 12/1975 | Shapiro et al. | 75/153 |

OTHER PUBLICATIONS

Temple, "Recent Developments in Properties and Protection of Copper for Electrical Uses", *Metallurgical Reviews*, vol. 11, 1966, pp. 47-49.

*Primary Examiner*—Peter K. Skiff
*Attorney, Agent, or Firm*—Frishauf, Holtz, Goodman & Woodward

[57] ABSTRACT

A copper base alloy for leads of an integrated circuit consisting essentially of from 0.5 to 1.5% by weight of iron, from 0.5 to 1.5% by weight of tin, from 0.01 to 0.35% by weight of phosphorus, and the balance of copper and inevitable impurities. Said alloy possesses satisfactory properties which are required of leads of integrated circuits.

1 Claim, No Drawings

COPPER BASE ALLOY FOR LEADS OF INTEGRATED CIRCUIT

BACKGROUND OF THE INVENTION

This invention relates to a copper base alloy for leads used in an integrated circuit (hereinafter called "IC"), and more particularly to such alloy which possesses satisfactory properties such as mechanical property, thermal resistance, corrosion resistance and thermal conductivity (electric conductivity) which are required of IC leads.

IC leads, which are bonded to an IC tip to serve as external lead wires, are usually made of a material such as copper base alloy. Such material for IC leads is generally required to satisfy the following property requirements:

(a) Sufficient mechanical property. That is, the following two requirements which are contradictory to each other must be fulfilled: While IC leads should neither twist nor bend when stress is applied to them during assemblage or transportation of ICs, they should not break when they are repeatedly bent in connecting them to wiring boards during mounting of ICs onto an electronic appliance. To satisfy the former requirement they should have necessary hardness, while to satisfy the latter requirement, they should have necessary elongation. If they show a Vicker's hardness of 135 –240 kg/mm$^2$ and an elongation of not less than 6%, they can satisfy the above-mentioned requirements.

(b) High thermal resistance. That is, an ordinary process of manufacturing ICs includes the steps of bonding a semiconductor tip (e.g., silicon tip) to a substrate, connecting IC leads to the semiconductor tip by means of gold wires or aluminum wires and coating said IC leads with silver or tin-lead solder alloy. In these steps, the IC leads are heated up to a temperature of 350°-400° C. On this occasion, the IC leads are softened by the heat, resulting in that their surfaces may have a reduced flatness, and simultaneously they may have a degradation in the mechanical property or hardness of the leads, which was imparted to a strip blank which is to be stamped into leads, during cold rolling thereof due to work hardening. Therefore, IC leads must have a thermal resistance enough to be free of softening even when heated to a temperature of from 350° to 400° C., that is, they should have a softening point of not less than 400° C. If the softening point is 400° C. or higher, that is, the higher the softening point is, the more excellent mechanical property and flatness the IC leads have, which eliminates the risk that the IC leads soften due to irregularities in the assembly working of the ICs during the above-mentioned steps.

(c) Low thermal conductivity. That is, in manufacturing an IC, a semiconductor tip and gold wires (or aluminum wires), etc. are packed in a plastic material, with the foot portions of the IC leads exposed. After this plastic packing, the exposed portions of the IC leads are coated with silver or tin-lead solder alloy. In mounting the IC into an electronic appliance, the IC leads are soldered onto a substrate or the like. In these steps, heat produced by said coating or soldering conducts in the IC leads, which may deteriorate the plastic package and a plastic bond binding together the semiconductor tip and the substrate. The possibility of such deterioration increases in proportion to the thermal conductivity of the IC leads. Therefore, it is desirable that IC leads should have a low thermal conductivity. Thermal conductivity being proportional to electric conductivity, generally the thermal conductivity of IC leads should be less than 60% I. A. C. S. (International Annealed Copper Standard) in terms of electric conductivity. However, if IC leads have a too low electric conductivity, they have a low heat radiation. Therefore, IC leads should have an electric conductivity of from 35 to 55% I. A. C. S.

(d) High corrosion resistance. That is, although silver or tin-lead solder alloy coating as previously referred to can improve the corrosion resistance of IC leads to some extent, corrosion may proceed in the IC leads during a long period of use, which may cause trouble unless the IC leads themselves have some corrosion resistance. The standard value of the corrosion resistance of IC leads should be 0.20 μm in terms of mean surface roughness which is obtained after a 48 hour's salt spray test according to Japanese Industrial Standard (JIS) Z 2371 and which is judged as a passable value. The IC leads should have a corrosion resistance corresponding to a value of mean surface roughness not higher than said standard value.

Alloys for IC leads should therefore have properties satisfying the requirements mentioned in the above paragraphs (a)-(d). That is, it can be concluded that an alloy which has a mechanical property, a thermal resistance, a thermal conductivity and a corrosion resistance satisfying the following values respectively is most suitable for IC leads:

(1) Vicker's hardness: 135–240 kg/mm$^2$
(2) Elongation: not less than 6%
(3) Softening point: not lower than 400° C.
(4) Electric conductivity: 35–55% I. A. C. S.
(5) Mean surface roughness after a salt spray test: not higher than 0.20 μm (after a 48 hour's salt spray)

While, alloys conventionally used in the manufacture of IC leads include a copper base alloy No. C 50700 (hereinafter called "CDA Alloy 507") which is in accordance with the standards established by CDA (Copper Development Association Inc.), and which has the following chemical composition:

Copper + tin + phosphorus: not less than 99.5%
Lead: not more than 0.05%
Iron: not more than 0.10%
Tin: 1.5–2.0%
Phosphorus: not more than 0.30%

Although this alloy shows satisfactory values in respect of hardness and elongation and also shows about 35% I. A. C. S. in respect of electric conductivity, it still fails to show satisfactory results in respect of thermal resistance and corrosion resistance.

OBJECT AND SUMMARY OF THE INVENTION

It is therefore the object of the invention to provide a copper base alloy for IC leads, which possesses satisfactory properties such as mechanical property, thermal resistance and thermal conductivity (electric conductivity) as well as corrosion resistance which are necessary for such leads.

According to the invention, there is provided a copper base alloy for IC leads, which consists essentially of:
Iron: 0.5–1.5% by weight,
Tin: 0.5–1.5% by weight,
Phosphorus: 0.01–0.35% by weight, and
Copper and inevitable impurities: the balance.

Said alloy has an improved electric conductivity due to the relatively small tin content, while the iron contained in the relatively high percentage not only prevents degradation in the mechanical property and the thermal resistance which would occur due to the small tin content, but also further improves the thermal resistance and the corrosion resistance.

DETAILED DESCRIPTION

The present applicants have made studies with respect to the above-mentioned CDA Alloy 507 in order to obtain an alloy which possesses satisfactory properties required of IC leads as referred to above, and have reached the following findings:

(i) In CDA Alloy 507, if the tin content is reduced below that prescribed for CDA Alloy 507, an improvement is obtained in respect of electric conductivity. While, any degradation in the mechanical property (hardness) and the thermal resistance due to the reduced tin content can be prevented by adding iron in an amount larger than that prescribed for CDA Alloy 507.

(ii) Moreover, the increased iron content further improves the thermal resistance as well as the corrosion resistance.

The copper base alloy for IC leads according to the invention which is based upon the above-mentioned findings consists essentially of:

Iron: 0.5–1.5% by weight,
Tin: 0.5–1.5% by weight,
Phosphorus: 0.01–0.35% by weight, and
Copper and inevitable impurities: the balance.

The reasons why the ingredient contents of the copper base alloy for IC leads according to the invention are limited as above will be described hereinbelow:

(a) Iron:

If the iron content is less than 0.5%, desired values connot be secured in respect of hardness, elongation, thermal resistance and corrosion resistance which should be possessed by IC leads. Whilst, if the iron content exceeds 1.5%, there occurs a degradation in the elongation and the electric conductivity such that the alloy cannot have 6% or more in elongation and 35% or more I. A. C. S. in electric conductivity. Therefore, the iron content has been limited within a range of from 0.5 to 1.5%.

(b) Tin:

If the tin content is less than 0.5%, the alloy cannot have values reguired of IC leads in respect of mechanical property (hardness and elongation) and corrosion resistance even when the iron content falls within the range of the present invention. Moreover, it has a too high electric conductivity which exceeds 55% I. A. C. S. While, if the tin content exceeds 1.5%, the electric conductivity of 35% I. A. C. S. or more cannot be secured. Therefore, the tin content has been limited within a range of from 0.5 to 1.5%.

(c) Phosphorus:

Phosphorus acts as deoxidizer to prevent the phenomenon that oxides exist in the crystal and the crystal grain boundary and improve the hot workability of a strip blank which is to be stamped into leads, as well as the mechanical property thereof. However, if contained in less than 0.01%, phosphorus cannot perform a desired deoxidizing action. While, if the phosphorus content exceeds 0.35%, there occurs a degradation in the electric conductivity, making it impossible to secure 35% or more I. A. C. S. Therefore, the phosphorus content has been limited within a range of from 0.01 to 0.35%.

The present invention will be more clearly understood by referring to the following example.

EXAMPLE

A plurality of copper base alloys having different chemical compositions as shown in Table 1 were melted according to an ordinary melting method, followed by casting according to a conventional semicontinuous casting method into copper base alloy blanks each having a size of 1400 mm in length, 360 mm in width and 150 mm in thickness. Then, said blanks were each subjected to hot rolling at a temperature of 850° C. into a thickness of 11 mm, and hence had both sides scalped by 0.5 mm per side into a thickness of 10 mm. The scalped blanks were cold rolled into a thickness of 1.0 mm. The cold rolled blanks were annealed in a furnace atmosphere at a temperature of about 500° C. for 60 minutes, followed by pickling in an aqueous solution of $H_2SO_4$ of concentration of 18%. These pickled blanks were again cold rolled into a thickness of 0.33 mm, and the cold rolled blanks were again annealed in a furnace atmosphere at a temperature of about 450° C. for 60 minutes, and then pickled in an aqueous solution of $H_2SO_4$ of concentration of 18% . The pickled blanks were subjected to final finish cold rolling at a reduction of 25% to obtain strip blanks of copper base alloys Nos. 1–9 according to the present invention and strip blanks of copper base alloys Nos. 10–16 for comparison each having a final thickness of 0.25 mm, which are all ready to be stamped into IC leads. In the copper base alloy strip blanks Nos. 10–15 for comparison, one or more of the iron, tin and phosphorus contents fall outside the scope of the present invention. While, the copper base alloy strip blank No. 16 for comparison has a chemical composition corresponding to CDA Alloy 507 conventionally used for IC leads.

Then, prepared from the above-mentioned copper base alloy strip blanks No. 1–9 according to the present invention and the above-mentioned copper base alloy strip blanks No. 10–16 for comparison were test pieces having sizes in accordance with the respective test rules of Japan Industrial Standard, except for those for the softening point test which each have a size of 30 mm in length, 20 mm in width and 0.25 mm in thickness. These test pieces were subjected to a Vicker's hardness test according to JIS Z 2244, a tension (elongation) test according to JIS Z 2241, an electric conductivity test according to JIS H 0505, a central line mean roughness (Ra) test according to JIS B 0601, and a softening point test under the following conditions.

TABLE 1

| Strip Blanks | | Chemical Composition (weight %) | | | | Vicker's Hardness 500g) | Elongation (%) | Softening Point (°C.) | Electric Conductivity (% I.A.C.S.) | Mean Surface Roughness (μm) |
|---|---|---|---|---|---|---|---|---|---|---|
| | | Fe | Sn | P | Cu | | | | | |
| Cu Alloy Strip Blank for Comparison | 10 | 0.20 | 0.95 | 0.12 | bal. | 133 | 9 | 390 | 38.5 | 0.28 |
| Cu Alloy Strip Blanks of the Invention | 1 | 0.55 | 1.00 | 0.11 | bal. | 140 | 8 | 430 | 45.2 | 0.18 |
| | 2 | 1.02 | 1.04 | 0.10 | bal. | 143 | 7 | 550 | 43.6 | 0.15 |
| | 3 | 1.43 | 1.00 | 0.10 | bal. | 150 | 6 | 560 | 35.9 | 0.12 |

TABLE 1-continued

| Strip Blanks | | Chemical Composition (weight %) | | | | Vicker's Hardness 500g) | Elongation (%) | Softening Point (°C.) | Electric Conductivity (% I.A.C.S.) | Mean Surface Roughness (μm) |
|---|---|---|---|---|---|---|---|---|---|---|
| | | Fe | Sn | P | Cu | | | | | |
| Cu Alloy Strip Blanks for Comparison | 11 | 1.63 | 1.03 | 0.12 | bal. | 152 | 5 | 580 | 33.8 | 0.11 |
| | 12 | 1.03 | 0.41 | 0.10 | bal. | 134 | 4 | 500 | 57.3 | 0.22 |
| Cu Alloy Strip Blanks of the Invention | 4 | 1.03 | 0.58 | 0.11 | bal. | 137 | 6 | 500 | 53.9 | 0.19 |
| | 5 | 1.04 | 1.04 | 0.11 | bal. | 144 | 7 | 550 | 43.2 | 0.16 |
| | 6 | 1.02 | 1.40 | 0.12 | bal. | 158 | 8 | 520 | 37.1 | 0.13 |
| Cu Alloy Strip Blanks for Comparison | 13 | 1.03 | 1.63 | 0.10 | bal. | 162 | 9 | 510 | 33.3 | 0.13 |
| | 14 | 1.09 | 0.85 | — | bal. | 141 | 4 | 470 | 34.6 | 0.15 |
| Cu Alloy Strip Blanks of the Invention | 7 | 0.84 | 1.10 | 0.03 | bal. | 141 | 7 | 530 | 44.7 | 0.16 |
| | 8 | 0.86 | 1.11 | 0.20 | bal. | 143 | 8 | 540 | 42.3 | 0.16 |
| | 9 | 0.88 | 1.08 | 0.32 | bal. | 148 | 6 | 560 | 38.1 | 0.17 |
| Cu Alloy Strip Blanks for Comparison | 15 | 0.86 | 1.09 | 0.41 | bal. | 150 | 5 | 570 | 31.2 | 0.17 |
| | 16 | — | 1.85 | 0.12 | bal. | 152 | 7 | 380 | 34.5 | 0.50 |

The softening point test was conducted as follows: A plurality of test pieces were prepared from each strip blank. They were heated in a furnace atmosphere at different temperatures for 60 minutes each. The heated test pieces were subjected to measurement of the Vicker's hardness. Of the measured test pieces, a test piece was picked out which showed a sudden drop in the hardness relative to those test pieces heated at lower temperatures, and the hearing temperature of said test piece was judged as the softening point.

The results of the above-mentioned tests are all indicated in Table 1.

It is noted from Table 1 that satisfactory properties required of IC leads are not possessed by the copper base alloy strip blanks Nos. 10-15 for comparison having one or more of the iron, tin and phosphorus contents falling outside the scope of the present invention and the copper base alloy strip blank No. 16 for comparison corresponding to conventional CDA Alloy 507, while on the copper base alloy strip blanks Nos. 1-9 according to the present invention all exhibit excellent values in all the properties tested and therefore can satisfy all the property requirements for IC leads.

As set forth above, the copper base alloy for IC leads according to the present invention fully satisfies all the requirements in respect of mechanical property, thermal resistance, thermal conductivity (electric conductivity) and corrosion resistance that IC leads must meet, and is therefore capable of exhibiting very excellent performance in use.

What is claimed is:

1. A copper base alloy for leads of an integrated circuit, which consists of from 0.5 to 1.5% by weight of iron, from 0.5 to 1.5% by weight of tin, from 0.01 to 0.35% by weight of phosphorus, and the balance of copper and inevitable impurities.

* * * * *